United States Patent [19]
Kooi
[11] 3,892,033
[45] July 1, 1975

[54] METHOD OF MANUFACTURING A SEMICONDUCTOR DEVICE

[75] Inventor: Else Kooi, Emmasingel, Eindhoven, Netherlands
[73] Assignee: U.S. Philips Corporation, New York, N.Y.

[22] Filed: Nov. 20, 1972
[21] Appl. No.: 308,033

Related U.S. Application Data

[63] Continuation of Ser. No. 111,357, Feb. 1, 1971, abandoned.

[30] Foreign Application Priority Data

Feb. 5, 1970 Netherlands.......................... 7001607

[52] U.S. Cl. .................... 29/576; 29/571; 148/187; 156/7; 156/17; 357/41; 357/47; 427/86
[51] Int. Cl. ............................................ H01l 7/50
[58] Field of Search ............ 29/571, 578, 580, 583; 156/3, 8, 11, 13, 17; 317/234, 235; 117/212; 148/175, 187

[56] References Cited

UNITED STATES PATENTS

| | | | |
|---|---|---|---|
| 3,320,485 | 5/1967 | Buie | 317/101 |
| 3,411,200 | 11/1968 | Formigoni | 29/580 |
| 3,677,846 | 7/1972 | Theunissen et al. | 156/17 X |

*Primary Examiner*—William A. Powell
*Attorney, Agent, or Firm*—Frank R. Trifari

[57] ABSTRACT

A method of manufacturing a semiconductor device comprising the steps of providing a semiconductor wafer comprising a first layer and a second layer that is of high-ohmic monocrystalline semiconductor material, and contains at least one recess extending only partially through said second layer, depositing a further semiconductor layer at the second layer to fill the recess and to form a semiconductor junction with the second layer, removing a portion of the semiconductor wafer by etching the first layer to reach the second layer and thereafter chemically etching a portion of the second layer to at least the monocrystalline semiconductor material deposited at the recess, and forming a semiconductor circuit element in at least one of the deposited monocrystalline semiconductor material and the second layer.

6 Claims, 10 Drawing Figures

INVENTOR.
ELSE KOOI
BY
AGENT

*INVENTOR.*

ELSE KOOI

*BY*

Frank R. Trifari
AGENT

INVENTOR.
ELSE KOOI
BY Frank R. Trifari
AGENT

INVENTOR.
ELSE KOOI
BY Frank R. Trifari
AGENT

METHOD OF MANUFACTURING A SEMICONDUCTOR DEVICE

The present application is a continuation of Ser. No. 111,357, filed Feb. 1, 1971 now abandoned and claims priority under Dutch Application No. 7001607, filed Feb. 5, 1970.

The invention relates to a method of manufacturing a semiconductor device having a semiconductor body in which at least one semiconductor circuit element is formed, at least one recess being provided on one side in a starting semiconductor body, semiconductor material being then deposited on said side and a semiconductor junction being obtained in the recess between the starting body and the material deposited epitaxially at that area; the invention furthermore relates to a semiconductor device manufactured by means of the method.

The semiconductor junction may be a p–n junction, a p–$p^+$ junction or an n–$n^+$ junction and/or a hetero junction between semiconductor materials of different chemical compositions.

A method of the type mentioned in the preamble is described, for example, in United Kingdom Pat. No. 1,072,703 and is referred to as "contour deposition." In this case, the semiconductor material which was deposited on the side of a disk-shaped starting body where the recess was provided, formed a layer having a surface which more or less had the shape of the surface of the starting body after the recess had been provided and before the semiconductor material had been deposited.

In order to be able to form the semiconductor circuit element in the recess, the deposited semiconductor material was then removed in such manner that a surface was obtained having a part which belonged to the starting body and a part which belonged to the material deposited in the recess.

The removal of semiconductor material was carried out mechanically by polishing.

It has proved to be rather difficult to remove the unevennesses of the deposited layer of semi-conductor material parallel to the surface of the starting body. Also, when the layer is removed only partly by polishing, any deviation from the parallel position of the polishing disk relative to the surface of the starting body will be noticeable in an incomplete removal of the semiconductor material and/or attack of the semiconductor body and the semiconductor material deposited in the recesses. This problem occurs in particular in the case of large disks, in which more than one recess is provided.

One of the objects of the invention is to avoid this problem at least for the greater part.

According to the invention, a method of the type mentioned in the preamble is characterized in that from a second side of the semiconductor body, which is situated opposite to the first side in which the recess is provided, material is removed until the semiconductor material deposited in the recess is at least exposed, at least one semiconductor circuit element being then formed in the deposited semiconductor material and/or the semiconductor body.

The second side of the starting body from which the semiconductor material is removed, can be given a plane surface in a conventional manner beforehand. The plane-shape of the surface can be maintained during the removal.

This removal may be carried out in a usual manner, for example, mechanically by polishing. In this case, it is not necessary for the starting body to be made accurately plane parallel as is the case in the known method.

In the known method described, the semiconductor body used as the starting material is made plane parallel and the deposited semiconductor material must be removed plane parallel relative to the oppositely located side of the body.

In the method according to the invention on the contrary, it is not necessary to make the starting semiconductor body accurately plane parallel, since in this case after the deposition of semi-conductor material, semiconductor material is removed from the oppositely located side of the starting body.

However, the invention is not restricted to the mechanical removal of semiconductor material from the second side of the semiconductor body. The semiconductor material may alternatively be removed by means of an etching process.

In a preferred embodiment of the method according to the invention, this is carried out both in plane parallel and in non-plane parallel starting bodies in that the starting body comprises a low-ohmic substrate on a surface of which a layer of high-ohmic semiconductor material is formed, in which layer the recess is provided, and after depositing semiconductor material at least the part of the substrate adjoining the high-ohmic layer is removed by a selective electrolytic etching treatment while maintaining the high-ohmic layer which is removed by a chemical etching treatment until the semiconductor material deposited in the recess is at least exposed.

In this case, actually, the selective etching treatment discontinues with the high-ohmic layer which can be formed in even thickness, for example, by epitaxial deposition and the surface of which has the same shape as that of the substrate on which said layer was originally formed and which can be given a plane shape in a usual manner. By choosing the high-ohmic layer, which is to be partly removed, to be thin, little material need be removed during the chemical etching treatment as a result of which the plane shape is maintained.

Selective electrolytic etching is a process which is known per se and is known, for example, from the prepublished U.S. Pat. No. 3,616,345. Selective electrolytic etching is possible, for example, in a silicon substrate of the n-type having a high-ohmic layer of the n or of the p-type and in a substrate of the p-type having a high-ohmic layer of the n-type. Selective electrolytic etching of hetero junctions is known, for example, from the U.S. Pat. No. 3,491,004 in which the removal of Ge relative to the CdS grown thereon is described.

Where, in the above, there is reference to low-ohmic (the substrate) and high-ohmic (the layer) in connection with the etching, said terms should be considered with respect to the different behaviour in the electrolytic etching treatment and not with respect to the properties in a semiconductor device.

In a second preferred embodiment of the method according to the invention, the surface of the semiconductor body is provided on the first side with a layer of a polycrystalline or an amorphous material, with the exception of the area where the recess is provided, prior to the deposition on said side of the semiconductor material.

This preferred embodiment has the following advantage as compared with the above-described known method. In the known method, circuit elements which are formed outside the semiconductor material which is deposited in the recesses are not insulated from each other.

In the last-mentioned preferred embodiment, however, the semiconductor material which is deposited on said polycrystalline or amorphous layer simultaneously with the semiconductor material which is deposited in the recess epitaxially, has a polycrystalline character and may have a large resistance.

In variations of the last-mentioned preferred embodiment, an aperture in the polycrystalline or amorphous layer is preferably surrounded, at the area where the recess is provided, by the polycrystalline or amorphous layer, or said aperture surrounds a part of the polycrystalline or amorphous layer.

In the resulting structures, mutually isolated circuit elements may be formed in the semiconductor material deposited in the recesses. Mutually isolated circuit elements can of course also be formed in the semiconductor body. The formation of mutually isolated circuit elements will still be explained in detail.

The invention furthermore relates to a semiconductor device manufactured by means of the method according to the invention.

In order that the invention may be readily carried into effect, it will now be described in greater detail with reference to a few examples and the accompanying drawings, in which.

EXAMPLE 1

Figure 1:
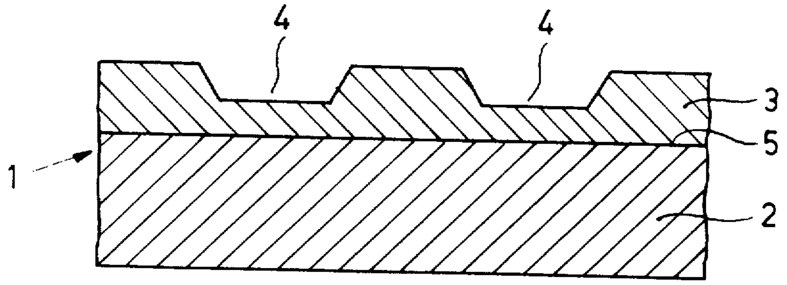
FIGS. 1 to 4 are diagrammatic cross-sectional views of a part of a first semiconductor device in successive stages during the manufacture when applying the method according to the invention.
Figure 2:
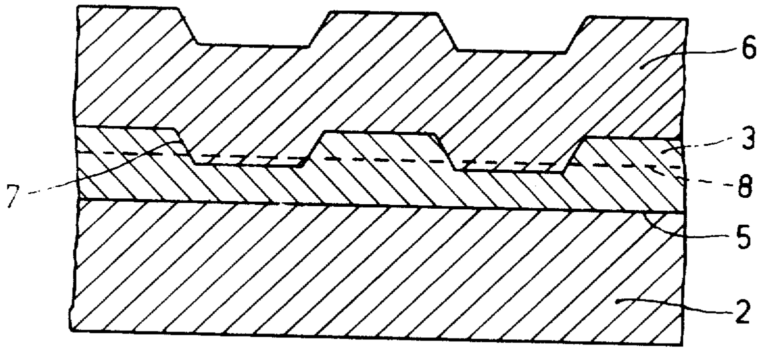
Figure 3:
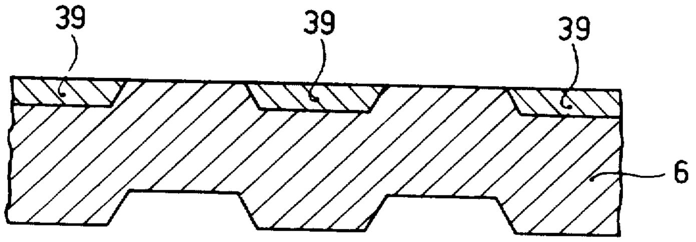

The starting body 1 as shown in FIGS. 1–4 comprises a disk-shaped low-ohmic silicon substrate 2 having a diameter of 3 cm and a thickness of 200 $\mu$m. At least one of the large surfaces of the substrate 2 is an {100} plane (5). By doping with As, the substrate 2 has n-type conductivity and a resistivity of 0.01 ohm.cm. A high-ohmic layer 3 which consists of p-type silicon and has a resistivity of 0.5 ohm.cm and a thickness of 20 $\mu$m is formed on the substrate 2 on the side of the plane 5. Recesses 4 are provided in the layer 3 down to a depth of 10 $\mu$m. Silicon is then deposited on the first side of the starting body where the recesses 4 have been provided, in the form of a layer 6 which forms a p–n junction 7 with the layer 3. The part of the layer 6 adjoining the p–n junction 7 is of the n-type and has a resistivity of 4 ohm.cm. The layer 6, at least the part thereof which adjoins the p–n junction 7 is deposited in a usual manner by thermal decomposition of silane from a gas current which contains $PH_3$ in addition to silane, at 1050°C and at a rate of 1 $\mu$m/min. The layer 6 is given a thickness of 150 $\mu$m. It is not necessary for the whole layer to be deposited epitaxially. It is also possible to epitaxially deposit only that part of the layer 6 which adjoins the p–n junction 7 to, for example 30 $\mu$m and then causing the layer to grow to 150 $\mu$m by vapour-depositing polycrystalline silicon, the semiconductor body being maintained at 950°C and the rate of vapour-deposition being 10 $\mu$m/min. The substrate 2 is then selectively etched away electrochemically down to the plane 5 by means of a method described in co-pending patent application Ser. No. 864,537, filed October 7, 1969 and now abandoned. The high-ohmic layer 3 is then etched away in a usual manner by means of a solution which contains HF, $NHO_3$ and acetic acid, until a layer of 2 $\mu$m has been removed from the silicon deposited in the recesses. The chemical etching treatment is continued as far as the broken line 8. The configuration shown in FIG. 3 consists of the n-type layer 6 containing therein p-type regions 39 which have remained from the high-ohmic layer 3 and is inverted with respect to FIG. 2.

Figure 4:
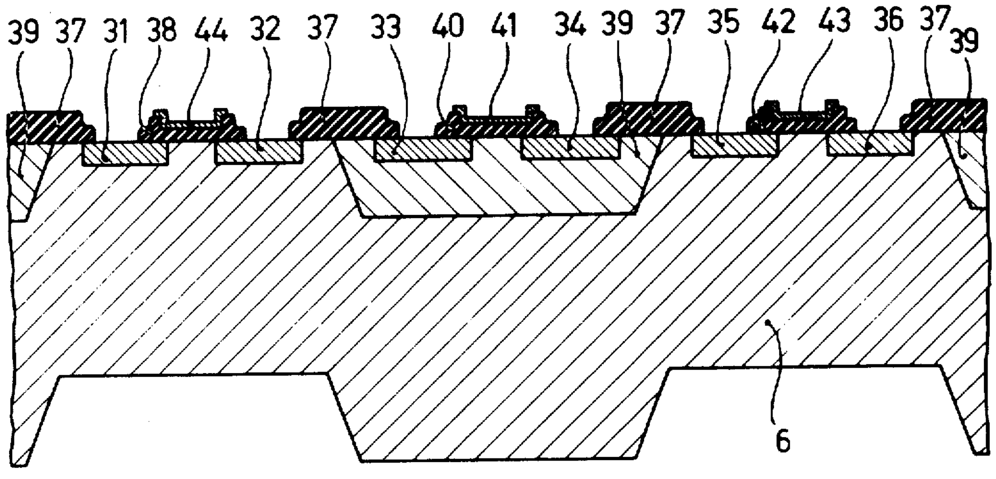

By means of such a configuration, for example, a complementary MOS transistor structure can be manufactured in a usual manner as is shown in FIG. 4.

In FIG. 4, 31 and 35 denote p-type source electrode regions 32 and 36 denote p-type drain electrode regions, 33 denotes an $n^3$-type source electrode region, 34 denotes an n-type drain electrode region, 37 is an insulating oxide layer, 38, 40 and 42 are oxide layers which serve for gate insulation, and 44, 41 and 43 denote metal gate electrodes.

EXAMPLE 2

Figure 5:
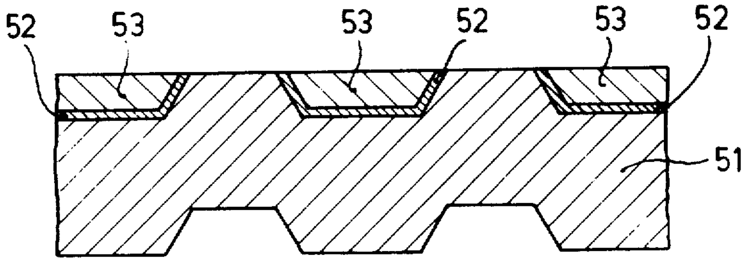
FIGS. 5 and 6 are diagrammatic cross-sectional views of a part of a second semiconductor device in successive stages during the manufacture when applying the method according to the invention.

The example to be described differs from example 1 in that after providing the recesses an impurity of the n-type is diffused throughout the surface on the first side as a result of which a zone having a resistivity of 0.01 ohm.cm is formed, after which p-type silicon is deposited epitaxially on the first side. After etching during which the substarte and a part of the high-ohmic layer are removed the configuration shown in FIG. 5 is obtained in which 51 denotes the layer which is formed by the epitaxially deposited p-type silicon, 52 denotes the zone formed by diffusion of an n-type impurity, and 53 denotes p-type regions which have remained from the high-ohmic layer.

Figure 6:
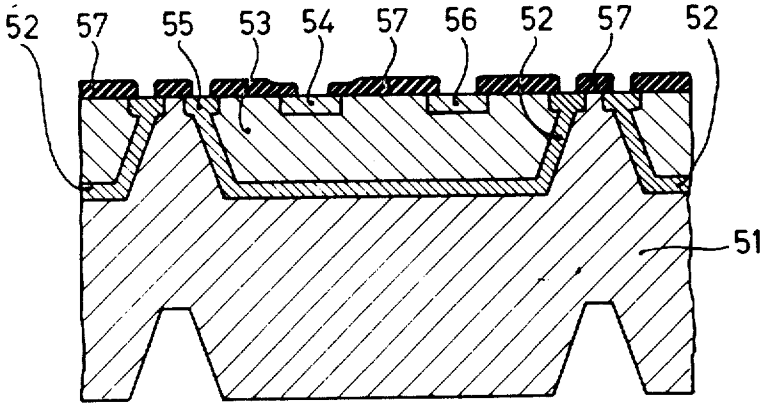

By means of this configuration, a transistor structure as shown in FIG. 6 can be obtained with a comparatively small number of alignment steps. In this figure a p-type region 53 serves as the base (having a p-type contact region 54), the zone 52 serves as the collector (having a contact region 55), and an $n^+$ type region 56 serves as the emitter. 57 denotes an oxide layer.

EXAMPLE 3

The recesses can be provided in the high-ohmic layer by etching in which a layer of amorphous material, for example, oxide, may serve as a mask. In order to obtain the structures described in the first two examples, said oxide layer must be removed after etching the recesses.

Figure 7:
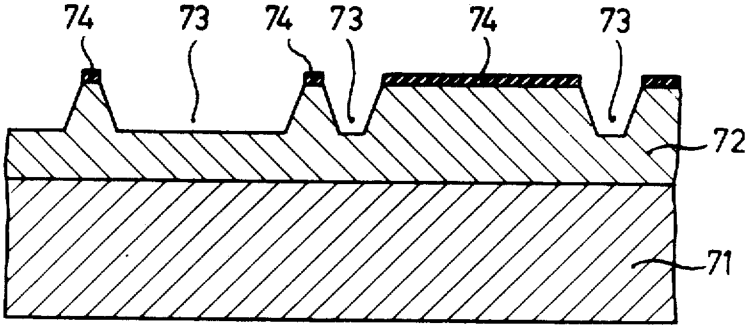
FIGS. 7, 8 and 9 are diagrammatic cross-sectional views of a part of a third semiconductor device in successive stages during the manufacture when applying the method according to the invention.

In the following example the oxide layer obtained in a usual manner, for example, by oxidation at elevated temperature is not removed. The resulting situation after etching is shown in FIG. 7, in which 71 denotes a low ohmic $n^+$ substrate, 72 a high-ohmic n-type layer, 73 the recesses and 74 the amorphous oxide layer.

Figure 8:
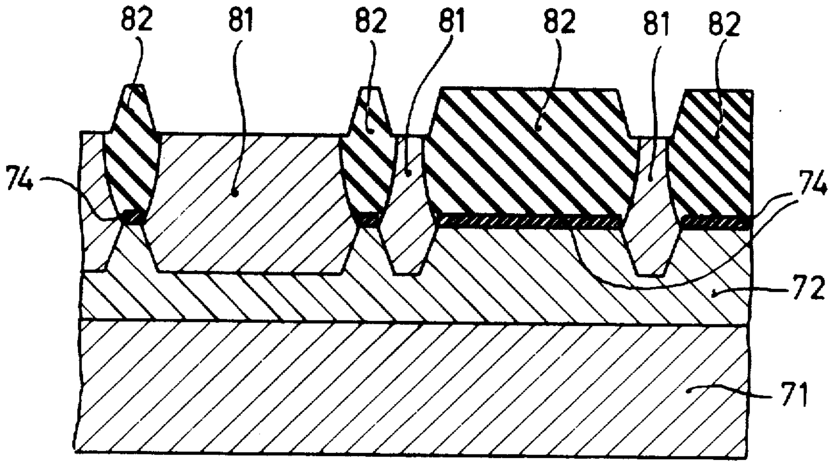

The subsequent deposition of the p-type silicon is carried out epitaxially in the recesses but polycrystalline on the oxide layer 74. The configuration shown in FIG. 8 is obtained in which 81 denotes the monocrystalline and 82 the polycrystalline parts of the layer formed by the deposited semiconductor material.

Figure 9:
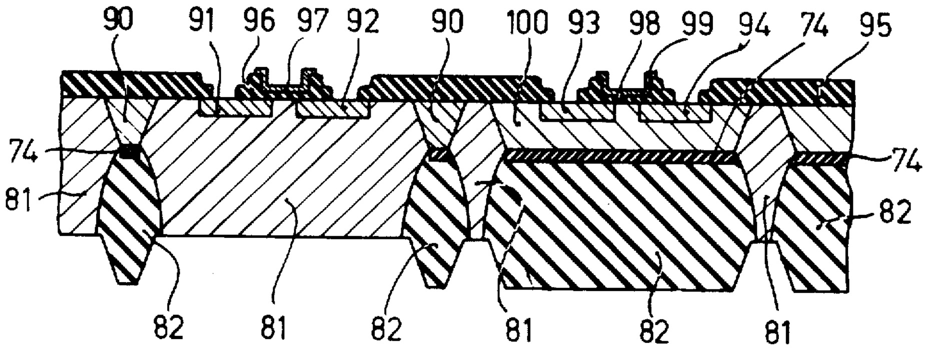
Figure 10:
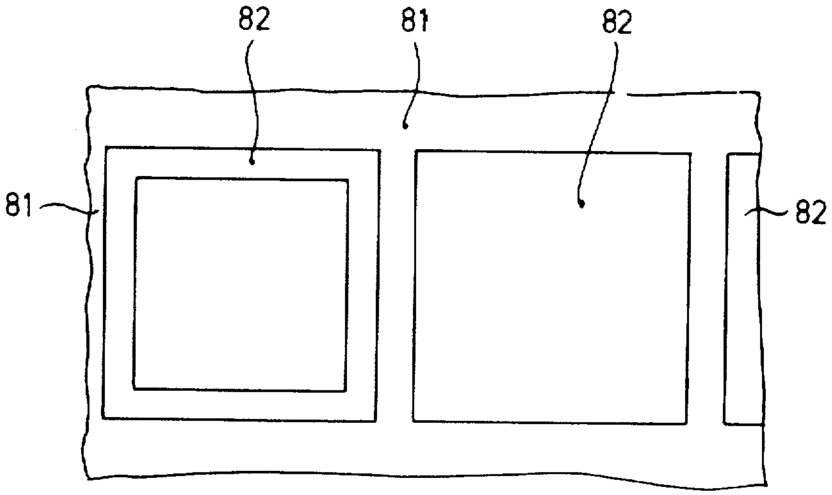
FIG. 10 is a plan view of the part of the third semiconductor device in the stage during the manufacture shown in FIG. 8.

As described in example 1, the substrate 71 and a part of the high-ohmic layer 72 are then etched away and a structure, as shown in FIGS. 9 and 10 analogous to the structure shown in FIG. 4 is manufactured in a usual manner.

In FIG. 9, 91 and 92 and 93 and 94, respectively, denote n-type and p-type, respectively, source electrode regions and drain electrode regions, 95 denotes an insulating oxide layer, 96 and 98 denote oxide layers, which serve for gate insulation, and 97 and 99 denote metal gate electrodes.

The advantage of such a structure is that mutually isolated MOS transistors can be obtained. Compared with the monocrystalline parts 81, the polycrystalline parts 82 have a very high resistivity. The MOS transistor shown on the left is of the depletion type. This transistor is embedded in the monocrystalline part 81 and insulated by an adjoining polycrystalline part 82 (and by monocrystalline p-type regions 90) from other monocrystalline n-type regions not shown in which MOS transistors of the depletion type have been formed.

An additional advantage is that as a result of the isolation by polycrystalline semiconductor material, the MOS transistors described can be given different voltages relative to the parts in which they have been formed.

The examples described only give a selection of the structures which can be manufactured by means of the method according to the invention.

For example, a great density of semiconductor devices can be reached on one disk by providing narrow and tapering recesses in the starting semiconductor body by means of a specific etchant known per se.

Semiconductor material may also be deposited in the recesses starting from, for example, silicon tetrachloride and hydrogen. In this method, no polycrystalline material is deposited on oxide which is present on the first side of the semiconductor body beside the recesses. This polycrystalline material may be deposited after the epitaxial filling of the recesses throughout the surface of the first side in a usual manner. So-called flatland structures may then be manufactured with such a configuration.

Semiconductor material may also be deposited from solution, e.g. a solution of silicon in tin.

In the method according to the invention, the starting semiconductor body shows the phenomenon of warping to a considerably smaller extent than in known methods, in which the recesses are also filled with polycrystalline semiconductor material.

What is claimed is:

1. A method of manufacturing a semiconductor device comprising the steps of:

a. providing a semiconductor wafer comprising a first layer of low-ohmic material having a plane surface and a second layer of high-ohmic monocrystalline semiconductor material of a first conductivity type disposed on said plane surface, said second layer comprising a major surface and at least one recess at said major surface, said recess extending only partially through said second layer;

b. depositing a further semiconductor layer having one of said first conductivity type and a second conductivity type at said high-ohmic second layer to fill said recess and to form a semiconductor junction with said second layer, at least that portion of said further semiconductor layer disposed at said recess being monocrystalline;

c. removing a portion of said semiconductor wafer from the opposite major surface of said semiconductor wafer by selective electrolytic etching of said low-ohmic first layer to said plane surface to reach said second layer and thereafter chemically etching a portion of said second layer to at least said monocrystalline semiconductor material deposited at said recess; and d. forming a semiconductor circuit element in at least one of said deposited monocrystalline semiconductor material and said second layer.

2. A method as defined in claim 1, further comprising the step of forming in parts of said further semiconductor layer located within said recess a region of conductivity opposite that of said further layer so as to form a second rectifying junction at said recess.

3. A method as defined in claim 1, wherein said first layer is one of said first conductivity type, said second conductivity type, and a third conductivity type.

4. A method as defined in claim 1, wherein portions of said second semiconductor layer define said recess, said method further comprising the step of forming at said recess-defining portions of said second semiconductor layer a zone having a conductivity opposite that of said further semiconductor layer and then carrying out the step of depositing said further semiconductor layer, so that part of said further semiconductor layer disposed at said recess and said zone form a rectifying junction at said recess.

5. A method as defined in claim 1, wherein said step of providing a semiconductor wafer comprises providing said first layer and producing a continuous layer of said high-ohmic monocrystalline semiconductor material on said plane surface of said first layer, said continuous layer having a major surface and being the precursor of said second layer, then providing a discontinuous layer of polycrystalline material on and only partially covering said major surface of said continuous layer and then forming said recess in said continuous layer through an opening in said polycrystalling layer so as to produce said second layer, portions of said further semiconductor layer subsequently disposed at said discontinuous layer being substantially polycrystalline.

6. A method as defined in claim 1, wherein said step of providing a semiconductor wafer comprises providing said first layer and producing a continuous layer of said high-ohmic monocrystalline semiconductor material on said plane surface of said first layer, said continuous layer having a major surface and being the precursor of said second layer, then providing a discontinuous layer of amorphous material on and only partially covering said major surface of said continuous layer and then forming said recess in said continuous layer through an opening in said amorphous layer so as to produce said second layer, portions of said further semiconductor layer disposed at said discontinuous layer being substantially polycrystalline.

* * * * *